(12) United States Patent
Fan

(45) Date of Patent: Sep. 7, 2004

(10) Patent No.: US 6,788,526 B2

(54) HOUSING STRUCTURE OF NETWORK DEVICE

(75) Inventor: Shu-Chu Fan, Hsinchu (TW)

(73) Assignee: D-Link Corporation, Hsinchu (TW)

( * ) Notice: Subject to any disclaimer, the term of this patent is extended or adjusted under 35 U.S.C. 154(b) by 148 days.

(21) Appl. No.: 10/267,583

(22) Filed: Oct. 10, 2002

(65) Prior Publication Data

US 2004/0070923 A1 Apr. 15, 2004

(51) Int. Cl.$^7$ ................................................ G06F 1/16
(52) U.S. Cl. ................... 361/679; 361/744; 361/784; 361/726; 312/108; 312/111; 248/346.01
(58) Field of Search ........................... 361/679, 683, 361/681, 682, 687, 697, 724–727, 744, 784, 800, 816, 818; 312/108, 111, 107, 107.5, 223.1, 223.2; 174/68.1, 72 A; 248/188, 188.2, 188.5, 188.6, 151, 346.01, 346.05, 346.06, 560, 633, 634, 638, 678; D14/100–114; D21/324, 333, 488, 503

(56) References Cited

U.S. PATENT DOCUMENTS

| | | | | |
|---|---|---|---|---|
| 4,718,858 A | * | 1/1988 | Godfrey et al. | 439/296 |
| 5,251,106 A | * | 10/1993 | Hui | 361/744 |
| 5,645,434 A | * | 7/1997 | Leung | 439/74 |
| 5,737,189 A | * | 4/1998 | Kammersgard et al. | 361/726 |
| 5,838,548 A | * | 11/1998 | Matz et al. | 361/784 |
| D412,322 S | * | 7/1999 | Wu | D14/433 |
| 5,992,953 A | * | 11/1999 | Rabinovitz | 312/111 |
| 6,056,256 A | * | 5/2000 | Ponce | 248/346.01 |
| 6,059,614 A | * | 5/2000 | Shelby et al. | 439/717 |
| 6,085,925 A | * | 7/2000 | Chung | 220/4.02 |
| 6,098,131 A | * | 8/2000 | Unger et al. | 710/303 |
| 6,328,612 B1 | * | 12/2001 | Chung | 439/717 |
| 6,597,567 B2 | * | 7/2003 | Stone et al. | 361/683 |
| 6,698,851 B1 | * | 3/2004 | Ludl | 312/108 |

* cited by examiner

*Primary Examiner*—Michael Datskovsky
(74) *Attorney, Agent, or Firm*—Bacon & Thomas PLLC

(57) ABSTRACT

The present invention is to provide a network device having a parallelepiped housing comprising a plurality of slots on two opposite sides and two opposite edges at each of an underside and a top and a plurality of pads each fastened the slots. This forms a short distance between a supporting surface and the underside of the housing by the projected pad. Also, housings of the same type of network devices can be stacked or horizontally coupled together by fastening the pads in the slots.

9 Claims, 7 Drawing Sheets

turing. All of these contradict the trend of cost effective and high efficiency of the hi-tech oriented society. Thus improvement exists.

HOUSING STRUCTURE OF NETWORK DEVICE

FIELD OF THE INVENTION

The present invention relates to network devices and more particularly to a housing structure of such network device with improved characteristics.

BACKGROUND OF THE INVENTION

Over the past decade there has been a considerable growth in information technology. Particularly, a variety of network devices have been developed and widely employed in our daily life and almost all trades. Such trend of expansion not only increases speed and efficiency of data communication but also brings a great convenience to our life and work. Also, more and more people demand high quality network products. As such, convenient services provided by network products are considered as an indicator of whether information industry of a country is more advanced as compared with other countries in the world.

Typically, each of the various commercially available network devices such as hubs, switches, modems, printer servers, gateways, and ISDNs (Integrated Services Digital Networks) has a housing. In one configuration a plurality of such network devices are coupled to a computer. Hence, a user can operate the computer to access the Internet by means of the coupled network devices. However, it is obvious that such plurality of network devices can occupy a considerable portion of limited space on or around the user's desk. Further, one network device may have a different size and/or shape from the other. Hence, the network devices cannot be orderly stacked. In fact, they are messy. This can cause difficulty in detecting, maintaining, and managing the network devices.

A commercially available network product having a stackable structure is shown in FIGS. 1A, 1B and 2. A housing 2 of an electronic device are held by two side brackets 10. The bracket 10 has a section of comprises upper and lower fastening sections 20 and 21, two opposite uprights 23 separated by an opening for connecting the upper and lower fastening sections 20 and 21 together, a U-shaped recess 24 defined by the upper and lower fastening sections 20 and 21 and the uprights 23, at least one fastening element (e.g., tab) 25 on a top surface of the upper fastening section 20 distal from the housing 2, and at least one mating fastening element (e.g., dent) 26 on an underside of the lower fastening section 21. As such, the fastening element 25 of one bracket 10 can be engaged with the mating fastening element 26 of another identical bracket 10 by stacking. Further, there are provided at least one securing element (e.g., two recesses as shown) 27 spaced apart from the fastening element 25 on the top surface of the upper fastening section 20. Furthermore, there are provided at least one mating securing element (e.g., two claws as shown) 28 spaced apart from the mating fastening element 26 on the underside of the lower fastening section 21 distal from the housing 2. As such, the mating securing element 28 of an upper bracket 10 can be engaged with the securing element 27 fo a lower bracket 10. By utilizing this, a plurality of housings 2, 3, 4, and 5 can be stacked by means of the brackets 10.

However, the network product is disadvantageous for being complicated in design, having a plurality of components of different shapes, being difficult to manufacture, consuming more material, and being expensive in manufacturing. All of these contradict the trend of cost effective and high efficiency of the hi-tech oriented society. Thus improvement exists.

SUMMARY OF THE INVENTION

An object of the present invention is to provide a network device having a parallelepiped housing comprising a plurality of slots on two opposite sides and two opposite edges at each of an underside and a top and a plurality of pads each fastened the slots. This forms a short distance between a supporting surface and the underside of the housing by the projected pad. Also, housings of the same type of network devices can be stacked or horizontally coupled together by fastening the pads in the slots.

DETAILED DESCRIPTION OF THE PREFERRED EMBODIMENTS

Figure 1B:
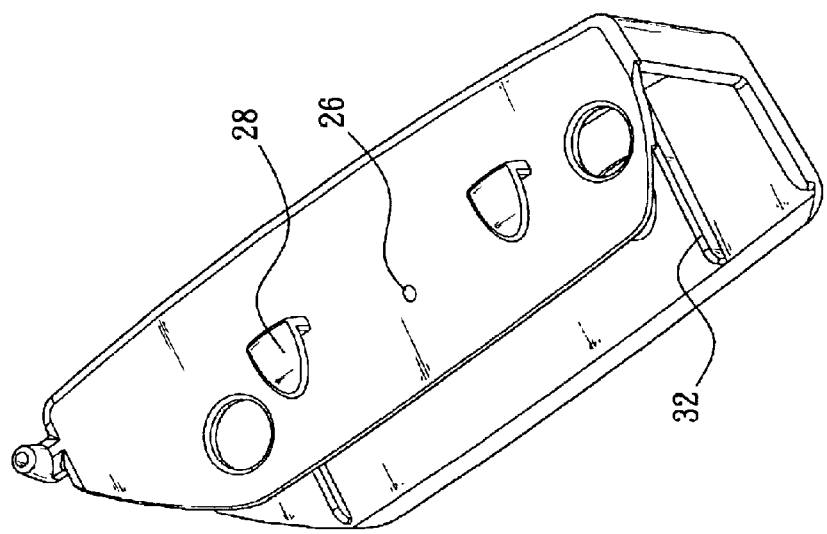
FIG. 1B is a similar view showing an underside of the FIG. 1A bracket.
Figure 1A:
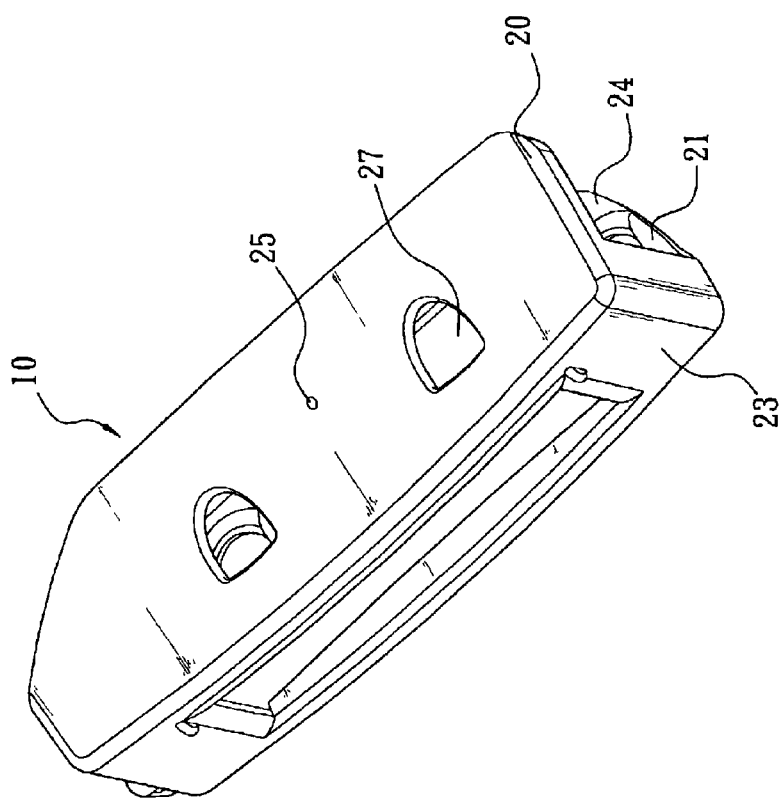
FIG. 1A is a perspective view of top of a conventional bracket for holding one side of housing of an electronic device.
Figure 2:
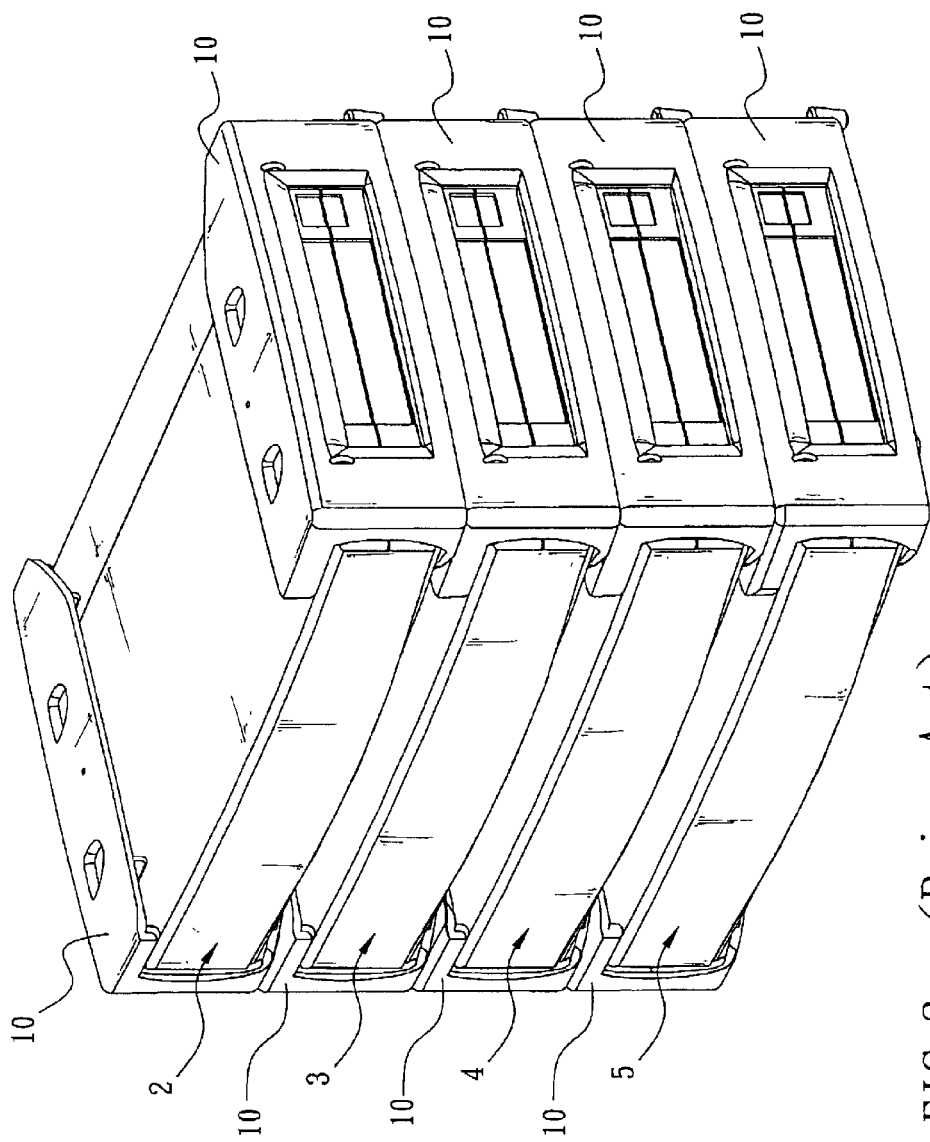
FIG. 2 is a perspective view of a plurality of electronic devices stacked by a plurality of pairs of the conventional brackets.
Figure 3:
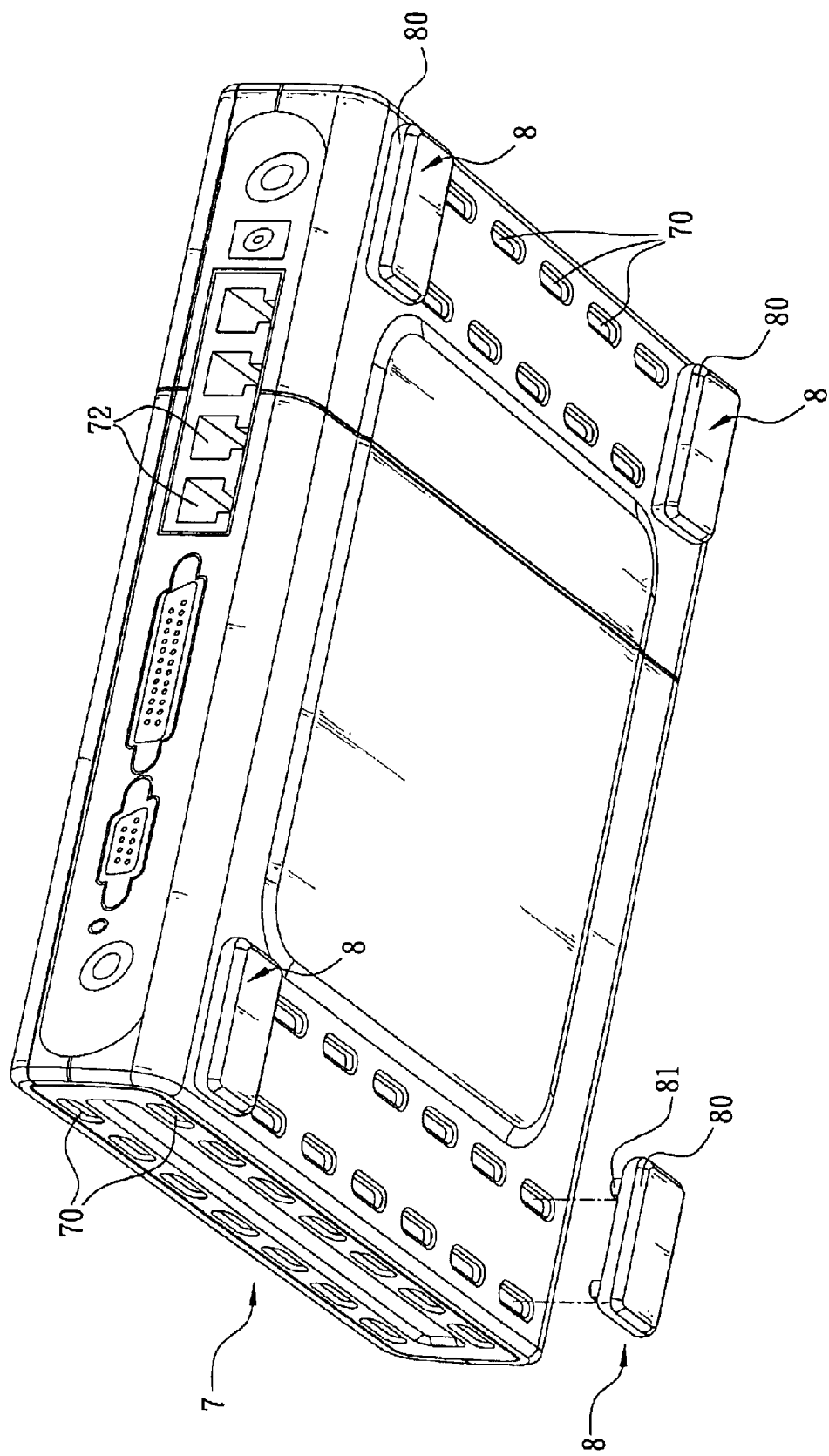
FIG. 3 is a perspective view of a network device having a housing structure according to the invention.
Figure 4:
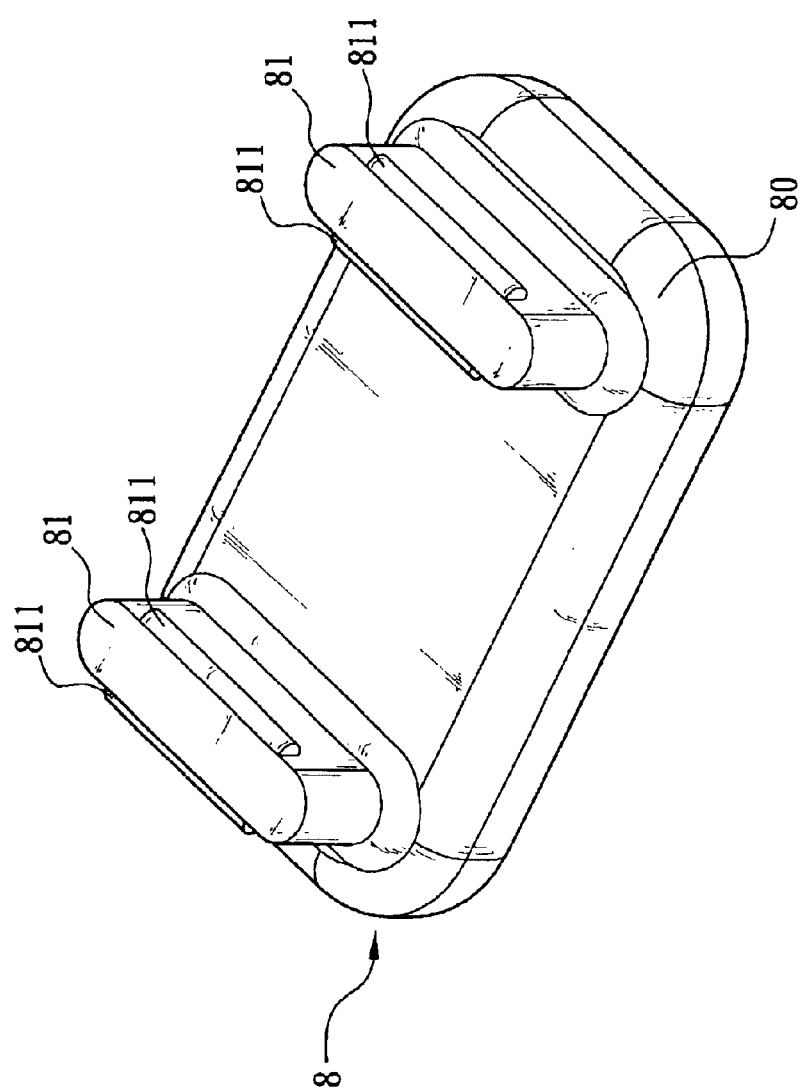
FIG. 4 is a perspective view of pad shown in FIG. 3.
Figure 5:
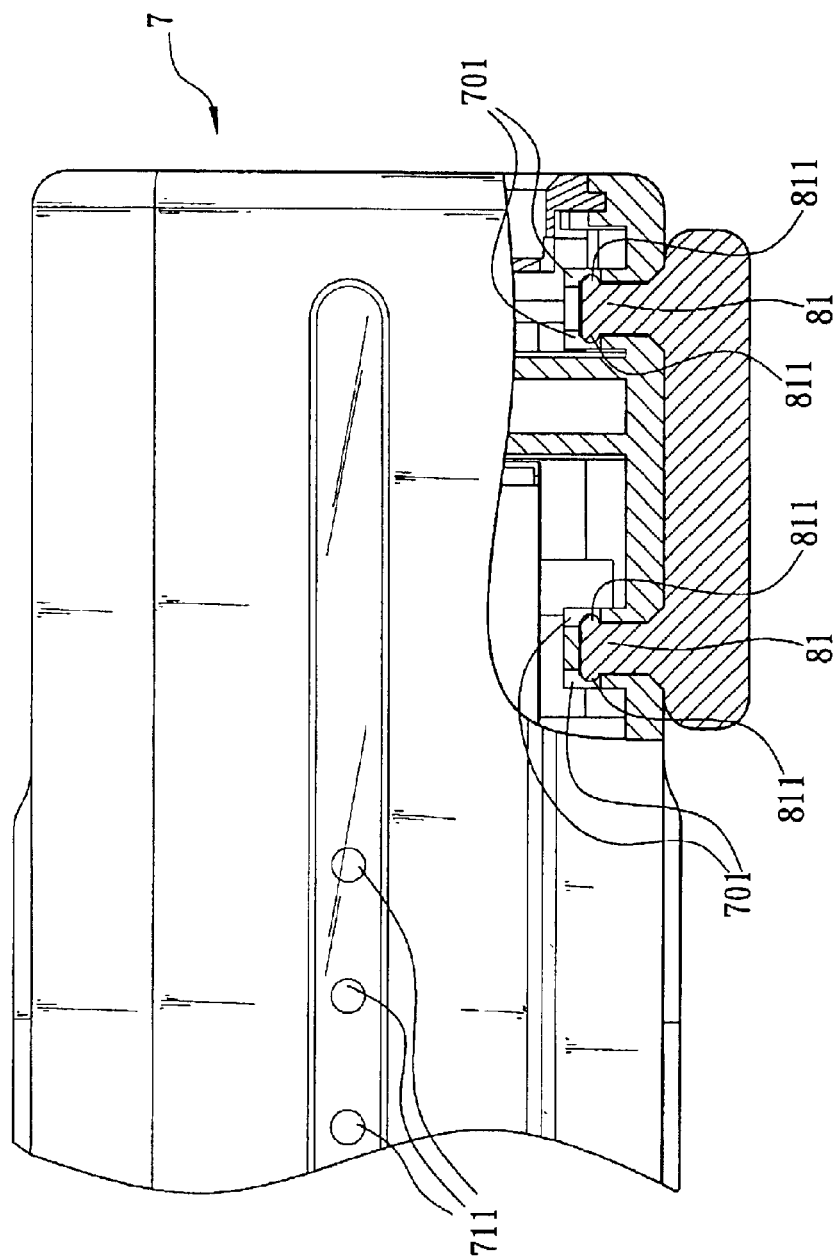
FIG. 5 is a side view in part section of a portion of housing shown in FIG. 3.

Referring to FIGS. 3, 4 and 5, there is shown a network device having a housing 7 constructed in accordance with the invention. The housing 7 is a parallelepiped and comprises a plurality of slots 70 on two opposite sides and two opposite edges at each of an underside and a top and a plurality of pads 8 each fastened to a pair of the slots 70. The pad 8 is a U-shaped member and comprises a flat horizontal base 80 and two parallel uprights 81. In installing the pad 8 in the slots 70 insert the uprights 81 into and secure to the slots 70 with top of the base 80 urged against the underside of the housing 7. This forms a projection (i.e., the thickness of the base 80) having a flat bottom so as to be stably supported on a supporting surface, i.e., there is a short distance between the supporting surface and the underside of the housing 7.

Figure 6:
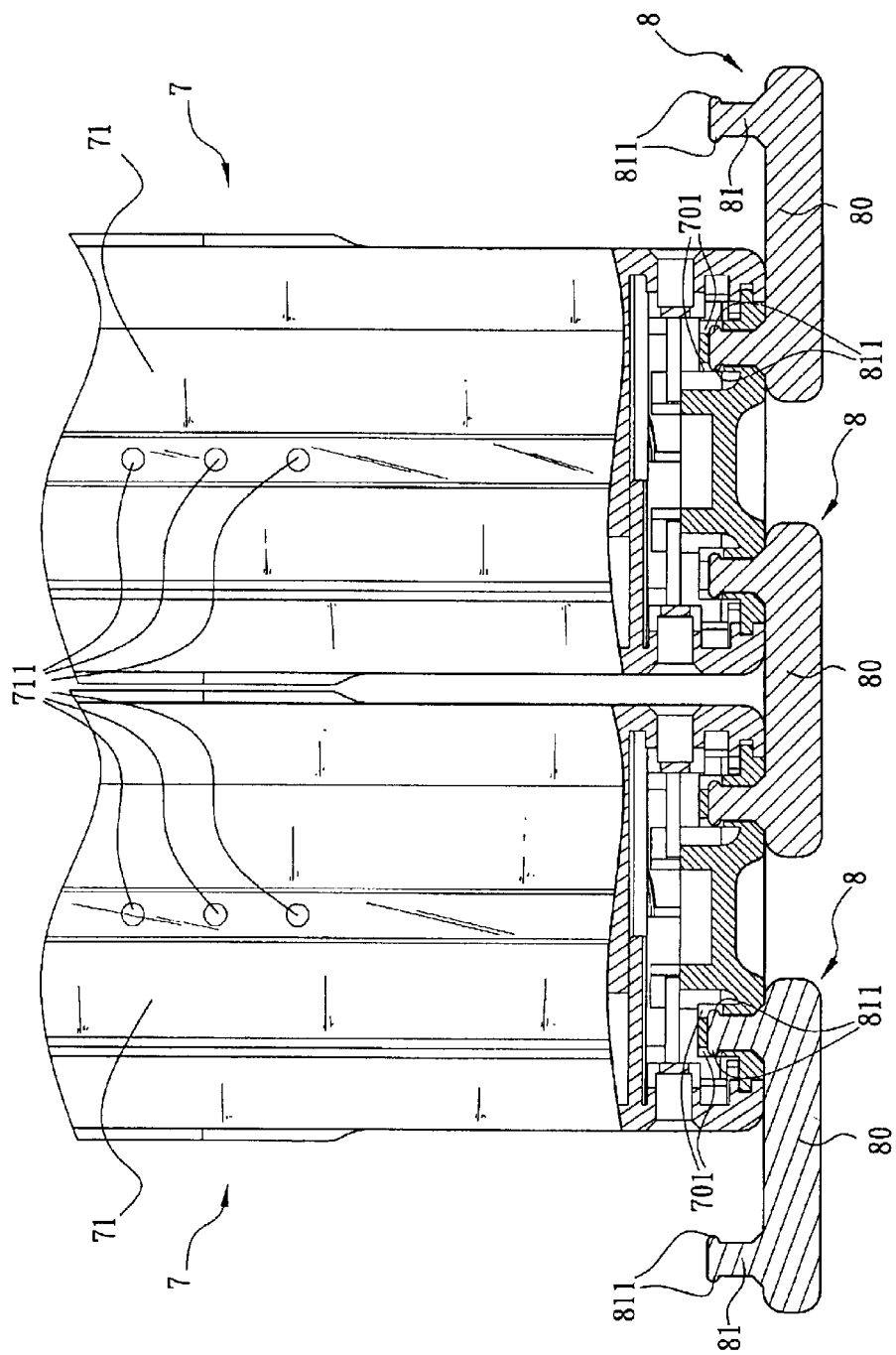
FIG. 6 is another side view in part section showing a coupling of two adjacent network devices by means of pad.

Referring to FIGS. 3 and 6, an operation of stacking or horizontally coupling the housings 7 of a plurality of network devices together is detailed below. Insert one upright 81 of the pad 8 into a slot 70 of one housing 7 and the other upright 81 thereof into an adjacent slot 70 of another housing 7. Thus, the housings 7 of the network devices can be stacked or horizontally coupled together by fastening the pads 8 in this manner. Also, two adjacent housings 7 are separated by a predetermined distance as provided by the base 80 of the coupled pad 8. This technique is quick and convenient. Further, each of the slot 70 and the pad 8 has a simple structure. Hence, the invention can eliminate conventional disadvantages such as complicated components and difficult manufacturing. Moreover, a plurality of network devices having the housing structure of the invention not only can be stacked as well-known but also can be horizontally coupled together.

Figure 7:
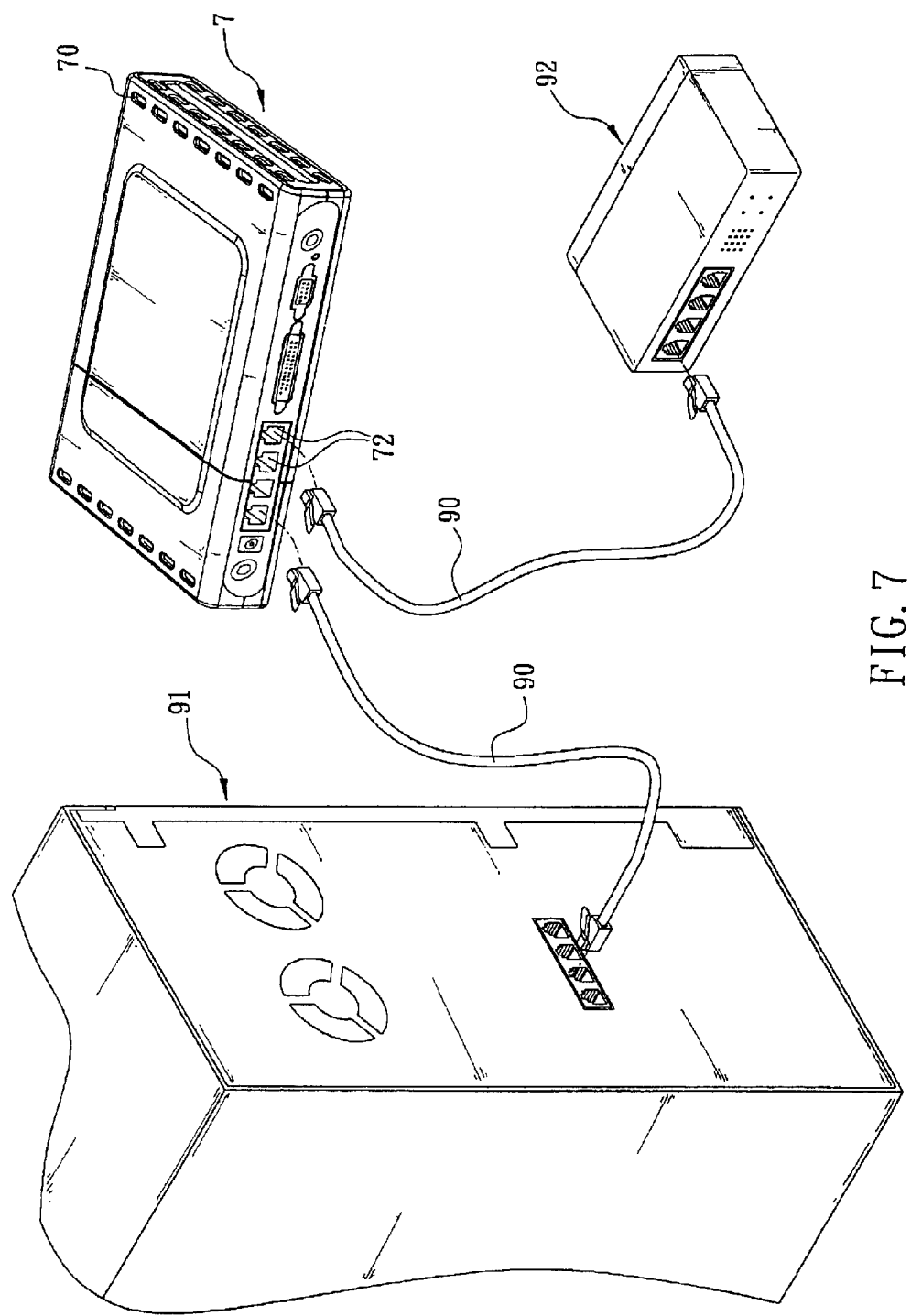
FIG. 7 is a perspective view showing a connection of two network devices and an electronic device.

Referring to FIGS. 6 and 7, in the invention there is provided at least one circuit board in the housing 7. The circuit board has a variety of electronic components mounted thereon. The electronic components are enabled to generate signals for connecting to a network (e.g., the Internet) in a normal operation. In addition, a display panel 71 and a plurality of ports 72 are formed on a side of the housing 7 without the provision of the slots 70. The display panel 71 comprises a plurality of light emitting elements 711 electrically coupled to the circuit board. Thus, a user can understand the status of an operating network device by observing the light emitting elements 711. A cable 90 for signal communication is interconnected between one port 72 on the housing 7 of the network device and an electronic device 91. Also, another cable 90 is interconnected between the other port 72 and a second network device 92. As such, the electronic device 91 and the second network device 92 are coupled together for signal communication. Referring to FIG. 3 specifically, heat generated by the electronic components in the housing 7 is transferred to a surface of the housing 7. Next, heat is dissipated from the surface of the housing 7 to the outside by convection. This can prevent too much heat from being accumulated in the housing 7. Otherwise, the network device may be damaged due to overheat.

However, it is also found that a rate of the heat dissipation by convection from surface is too slow. Further, there is a possibility that the electronic components in the housing 7 may be damaged in such undesired heat dissipation environment. Hence, in the invention an opening 701 is provided in either an inner wall having the provision of the slots 70 distal from one side of the housing 7 or at a junction of the bottom and the inner wall of the slots 70 as referring to FIGS. 3, 5, and 6. Hence, only several ones of the slots 70 on the housing 7 are coupled to the pads. 8. This can maintain a stable seating of the housing 7 on the supporting surface. As to the opening 701 in the other slots 70 on the housing 7 disconnected from the pad 8 is open to the outside so that heat generated in the housing 7 can be transferred to air. Moreover, a position at an edge of the opening 701 coupled to the bottom of the slots 70 is perpendicular to the side of the slots 70. Thus, spark generated by the malfunctioned electronic components in the housing 7 cannot fall out of the housing 7 from the opening 701.

For facilitating a fastening of the pad 8 in the slots 70 or removing the same from the slots 70, the pad 8 preferably is formed of a flexible material. Also, in the invention a ridge 811 is formed at either side of either upright 81 of the pad 8 for avoiding the pad 8 from being easily disengaged from the slots 70 as referring to FIGS. 3, 4, and 5. With this configuration, the ridges 811 are urged against inside of the opening 701 after the pad 8 has been inserted into the slots 70. This can prevent the pad 8 from disengaging the slots 70 easily.

Referring to FIG. 3, in the embodiment the slots 70 at one side of the housing 7 are arranged parallel adjacent edges of the housing 7 in a pairing relationship. As a result, the housing 7 can be stably supported on a horizontal supporting surface after the pads 8 have been inserted in the slots 70.

What is claimed is:

1. A structure of a network device comprising:

a parallelepiped housing for enclosing the network device;

a plurality of slots on two opposite sides and two opposite edges at each of an underside and a top of the housing; and a plurality of pads each fastened to one slot of the housing of the network device and one slot of a housing of an adjacent network device.

2. The structure of claim 1, wherein the pad is shaped as a U and comprises:

a flat base; and two parallel uprights projected from one side of the pad for inserting into and securing to the slots so as to project the base from the housing.

3. The structure of claim 1, wherein the housing comprises at least one interior circuit board having a variety of electronic components mounted thereon, the electronic components being enabled to generate signals for connecting to a network.

4. The structure of claim 1, wherein the housing further comprises a display panel and a plurality of ports formed on a side of the housing without the provision of the slots, the display panel having a plurality of light emitting elements electrically coupled to the circuit board, and the ports being connectable to a cable for signal communication.

5. The structure of claim 1, wherein the housing further comprises an opening in an inner wall having the provision of the slots distal from a side of the housing so that in response to a coupling of a first portion of the slots on the housing to the pads and a disconnection of a second remaining portion of the slots on the housing from the pads, the housing is in communication with outside.

6. The structure of claim 1, wherein the housing further comprises an opening at a junction of a bottom and the inner wall of the slots so that in response to a coupling of a first portion of the slots on the housing to the pads and a disconnection of a second remaining portion of the slots on the housing from the pads, the housing is in communication with outside.

7. The structure of claim 1, wherein each of the pads is formed of a flexible material.

8. The structure of claim 5, wherein each of the uprights comprises a ridge at either side, the ridges being urged against inside of the opening after the pad has been inserted into the slots.

9. The structure of claim 1, wherein the slots at one side of the housing are arranged parallel adjacent edges of the housing in a pairing relationship.

* * * * *